(12) United States Patent
Heiries et al.

(10) Patent No.: US 10,267,863 B2
(45) Date of Patent: Apr. 23, 2019

(54) AUTOMATIC METHOD FOR DETERMINING THE STATE-OF-CHARGE OF A BATTERY

(71) Applicant: Renault S.A.S., Boulogne-Billancourt (FR)

(72) Inventors: Vincent Heiries, Saint-Jean-de-Moirans (FR); Sylvain Leirens, Grenoble (FR)

(73) Assignee: RENAULT S.A.S., Boulogne-Billancourt (FR)

( * ) Notice: Subject to any disclaimer, the term of this patent is extended or adjusted under 35 U.S.C. 154(b) by 1 day.

(21) Appl. No.: 15/528,573

(22) PCT Filed: Nov. 26, 2015

(86) PCT No.: PCT/FR2015/053243
§ 371 (c)(1),
(2) Date: May 22, 2017

(87) PCT Pub. No.: WO2016/083757
PCT Pub. Date: Jun. 2, 2016

(65) Prior Publication Data
US 2017/0276734 A1    Sep. 28, 2017

(30) Foreign Application Priority Data

Nov. 28, 2014  (FR) ..................................... 14 61618

(51) Int. Cl.
*G01R 31/36* (2019.01)
*G01R 31/00* (2006.01)
(Continued)

(52) U.S. Cl.
CPC ......... *G01R 31/367* (2019.01); *G01R 31/007* (2013.01); *G01R 31/3648* (2013.01);
(Continued)

(58) Field of Classification Search
CPC ............ G01R 31/3637; G01R 31/3651; G01R 31/3624; G01R 31/3658
See application file for complete search history.

(56) References Cited

U.S. PATENT DOCUMENTS

| | | | |
|---|---|---|---|
| 2003/0211372 A1* | 11/2003 | Adams | H01M 8/04238 320/101 |
| 2005/0023056 A1* | 2/2005 | Harrup | B60K 7/0007 180/65.6 |

(Continued)

OTHER PUBLICATIONS

Plett, Gregory L., "Extended Kalman Filtering for Battery Management Systems of LiPB-based HEV battery packs, Part 1. Background" Journal of Power Sources, 134, pp. 252-261 (2004).
(Continued)

*Primary Examiner* — Huy Q Phan
*Assistant Examiner* — Zannatul Ferdous
(74) *Attorney, Agent, or Firm* — Occhiuti & Rohlicek LLP (57) ABSTRACT

Automatically determining state-of-charge of a battery with cells includes, for each cell, scheduling refreshment times for the cell as a function of the cell's priority level, at times that correspond to refreshment times for the first cell, fully executing an estimation algorithm for the first cell, for at least a second cell of the set of cells, and at times other than those that correspond to refreshment times for the second cell, partially executing the estimation algorithm for the cell thereby obtaining an estimate of the second cell's state-of-charge, and determining a state-of-charge of the battery from states-of-charge estimated for each of the cells of the battery. The estimation algorithm estimates a cell's state-of-charge at a particular time as a function of a measured voltage and a measured current, both of which are obtained at the particular time. As a result of having scheduled refreshment times for each cell based on priority levels for the cell, a first (Continued)

cell from the plurality of cells has its state-of-charge estimate refreshed more frequently than a second cell from the plurality of cells when the first cell has a higher priority than the second cell.

8 Claims, 4 Drawing Sheets

(51) Int. Cl.
G01R 31/367 (2019.01)
G01R 31/396 (2019.01)
(52) U.S. Cl.
CPC ..... G01R 31/3651 (2013.01); G01R 31/3658 (2013.01); G01R 31/396 (2019.01)

(56) References Cited

U.S. PATENT DOCUMENTS

| | | |
|---|---|---|
| 2010/0169033 A1 | 7/2010 | Isaksson et al. |
| 2014/0272653 A1 | 9/2014 | Chaturvedi et al. |
| 2015/0369873 A1* | 12/2015 | Nakao ............... G01R 31/3606 702/63 |
| 2017/0062878 A1* | 3/2017 | Povey ................ B60L 11/1866 |
| 2017/0067967 A1* | 3/2017 | Bryngelsson ............ B60L 3/12 |

OTHER PUBLICATIONS

Plett, Gregory L., "Extended Kalman Filtering for Battery Management Systems of LiPB-based HEV battery packs, Part 2. Modeling and Identification" Journal of Power Sources, 134, pp. 262-276 (2004).

Plett, Gregory L., "Extended Kalman Filtering for Battery Management Systems of LiPB-based HEV battery packs, Part 3. State and Parameter Estimation" Journal of Power Sources, 134, pp. 277-292 (2004).

Y. Bar-Shalom, et al.: "Estimation With Applications to Tracking and Navigation, Theory Algorithms and Software", Wiley Interscience, 2001.

Mehra, R.K: "On the identification of variances and adaptative Kalman Filtering", Automatic Control, IEEE Transaction on, vol. 15, No. 2, pp. 175-184, Apr. 1970.

* cited by examiner

$$62 \rightarrow x_{k+1} = \begin{bmatrix} SOC_{k+1} \\ V_{D,k+1} \end{bmatrix} = \begin{bmatrix} 1 & 0 \\ 0 & 1 - \frac{Te}{R_D \cdot C_D} \end{bmatrix} \cdot \begin{bmatrix} SOC_k \\ V_{D,k} \end{bmatrix} + \begin{bmatrix} -\frac{Te}{C_{n,k3}} \\ \frac{Te}{C_D} \end{bmatrix} \cdot i_k + w_k$$

Fig. 4

$$64 \rightarrow y_k = OCV(SOC_k) - V_{D,k} - RO_{k2} i_k + v_k$$

Fig. 5

$$70 \rightarrow RO_{k2+1} = RO_{k2} + w_{2,k2}$$

Fig. 6

$$72 \rightarrow u_{k2} = \sum_{m=k-N}^{k} [OCV(SOC_m) - V_{D,m} - RO_{k2} \cdot i_m] + v_{2,k2}$$

Fig. 7

$$74 \rightarrow C_{n,k3+1} = C_{n,k3} + v_{3,k3}$$

Fig. 8

$$76 \rightarrow z_{k3} = \frac{(SOC_k - SOC_{k-N})}{N\,Te} \cdot 3600 \cdot C_{n,k3} + v_{3,k3}$$

$$232 \longrightarrow x_{k+1} = \begin{bmatrix} RO_{k4+1} \\ C_{n,\,k4+1} \end{bmatrix} = \begin{bmatrix} 1 & 0 \\ 0 & 1 \end{bmatrix} \cdot \begin{bmatrix} RO_{k4} \\ C_{n,\,k4} \end{bmatrix} + w_{d,\,k4}$$

Fig. 15

$$234 \longrightarrow \begin{bmatrix} u_{k4} \\ z_{k4} \end{bmatrix} = \begin{bmatrix} \sum_{m=k-N}^{k} [OCV(SOC_m) - V_{D,\,m} - RO_{k4} \cdot i_m] \\ \dfrac{(SOC_k - SOC_{k-N})}{N\,T_e} \cdot 3600 \cdot C_{n,\,k4} \end{bmatrix} + v_{d,\,k4}$$

$$250 \longrightarrow x_{k+1} = \begin{bmatrix} RO_{k4+1} \\ C_{n,\,k4+1} \end{bmatrix} = \begin{bmatrix} \left(\alpha + \dfrac{\beta N_k^C}{N_{EOL}^C}\right) & 0 \\ 0 & \left(1 + \dfrac{\gamma \cdot N_k^C}{N_{EOL}^C}\right) \end{bmatrix} \begin{bmatrix} RO_k \\ C_{n,\,k} \end{bmatrix} + w_{d,\,k}^a$$

Fig. 18

AUTOMATIC METHOD FOR DETERMINING THE STATE-OF-CHARGE OF A BATTERY

RELATED APPLICATIONS

This is the national stage of international application for PCT/FR2015/053243, filed on Nov. 26, 2015, which claims the benefit of the Nov. 28, 2014 priority of French application FR 1461618, the contents of which are herein incorporated by reference.

FIELD OF INVENTION

The invention concerns battery management, and determining a battery's state-of-charge.

BACKGROUND

A battery is composed of several electrical energy storage cells. These cells are electrically connected to one other between two electrical terminals of the battery.

A known way to determine a battery's state-of-charge includes, at each time k and for each cell of the battery, measuring, for each cell, the value $y_k$ of the voltage between terminals of that cell and the current $i_k$ of the charge or discharge current of that cell. Then, at least at certain of these times k, and for each cell, an electronic calculator estimates the state-of-charge, $SOC_k$, of the cell as a function of the value $y_k$ and the current $i_k$ measured for that cell at that time k. The battery's overall state-of-charge can then be estimated from the states-of-charge estimated for each of its cells.

A cell's state-of-charge is not a physical quantity that is directly measurable. Thus, it must be estimated. Its estimation requires implementing an estimation algorithm. Such algorithms are non-trivial and require considerable computational power. For example, such estimation algorithms are described in part 3 of the following article: L. Plett, et al.: "*Extended Kalman filtering for battery management systems of LiPB-based HEV battery packs*", journal of Power Sources, 2004, page 252-292. Hereinafter, this article shall be denoted as "Plett 2004."

Known methods thus estimate states-of-charge at each time k and then use those states to estimate an overall state-of-charge for the battery. These known methods work well. But they require a considerable computational resources.

SUMMARY

The invention includes a method for determining a battery's state-of-charge with reduced computational load while still being able to estimate the state-of-charge with precision comparable to that of known methods.

The claimed method exploits the fact that a cell's state-of-charge remains relatively constant when the voltage between its terminals varies little. The method exploits this by controlling an extent to which an estimation algorithm executes based at least in part on how much this voltage varies. In particular, when the voltage between these terminals varies but little, the method limits the frequency with which an algorithm for estimating the cell's state-of-charge of a cell whose voltage varies little is fully executed. This limits the computational load needed to determine the battery's state-of-charge and does so without losing significant precision in the resulting estimate. Moreover, since there is no need to fully execute the estimation algorithm quite so often, it becomes possible to free up time for the electronic computer to perform other tasks.

Various practices of the foregoing method offer certain advantages.

For example, there are times when an incorrect estimate of a cell's state-of-charge will be more ruinous to the cell. In particular, when a cell's voltage is elevated, an incorrect estimate runs the risk of overcharging. Conversely, when a cell's voltage is below some threshold, an incorrect estimate raises the risk of undercharging the cell. By increasing the estimate's refresh frequency under either of these circumstances, the method thus limits the risk of damaging the cell.

An advantage also arises when the computer takes a short cut in estimating the cell's state-of-charge at each time k. For example, if the computer only calculates a state-of-charge prediction without going on to correct that prediction, it becomes possible to have, at each time k, an updated estimate of each cell's state-of-charge. This increases the precision when determining the battery's state-of-charge. And it does so without increasing, in any substantial manner, the computational load required for such a determination. This is because calculating the prediction imposes a considerably lower computational load than correcting it.

Another advantage arises from identifying twin cells and then completely executing the state-of-charge estimation algorithm for only a single one of the twin cells. This too limits the computational load without significant loss of precision when determining the battery's state-of-charge.

In another aspect, the invention features a tangible and non-transitory data-recording medium containing instructions to execute the above automatic determination method when these instructions are executed by an electronic computer.

In yet another aspect, the invention features an automobile containing a battery management system that executes the foregoing estimation method.

As used herein, "computing load" refers to the number of operations performed by an electronic computer. Thus, decreasing the computing load means decreasing the number of operations to be performed to achieve the same result or a result of the same kind.

BRIEF DESCRIPTION OF THE DRAWINGS

The invention will be better understood upon perusal of the following description, given solely as a nonlimiting example, and referring to the drawings, in which.

In these figures, the same references are used to denote the same elements. In the remainder of this description, characteristics and functions well-known to the person skilled in the art are not described in detail.

DETAILED DESCRIPTION

Figure 1:
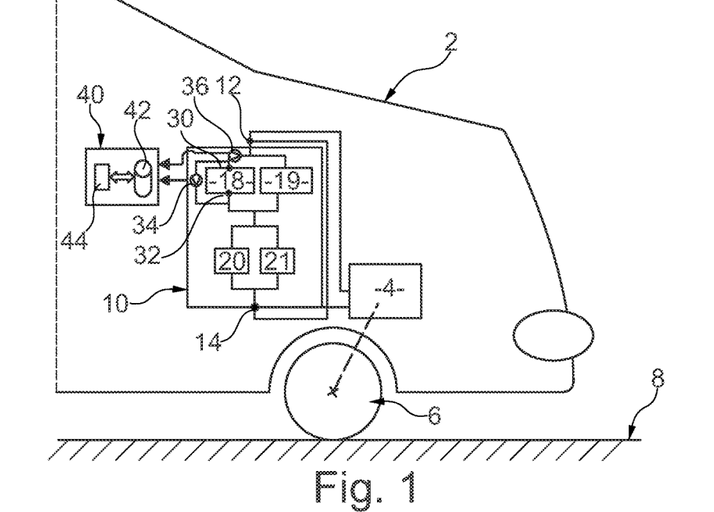
FIG. 1 is a partial schematic illustration of an automobile outfitted with an electrical battery.

FIG. 1 shows an electric vehicle 2 having an electric motor 4 and a battery 10 that provides electrical energy for the motor 4. The electric motor 4 ultimately rotates wheels 6 to make the vehicle 2 move along a roadway 8.

The battery 10 comprises two terminals 12, 14 for electrical connection to whatever load is to be energized, which in this case is the vehicle's electric motor 4. Several electric cells 18, 19, 20, 21 are electrically connected between the terminals 12, 14. Typically, these electric cells 18, 19, 20, 21 are grouped into several stages with these stages then being connected in series between the terminals 12, 14. To simplify FIG. 1, only four electric cells 18, 19, 20, 21 are shown.

FIG. 1 shows only two stages: a first stage comprising first and second cells 18, 19; and a second stage comprising third and fourth cells 20, 21. Each stage comprises several branches connected in parallel. Each branch of a stage comprises one electric cell or several electric cells in series. In the illustrated embodiment, the first stage comprises two branches, each branch having a single electric cell, with the second stage being structurally identical to the first stage. Except for manufacturing tolerances, all the cells of the battery 10 are structurally identical. Consequently, only the first cell 18 shall now be described in further detail. As a result, the adjective "first" is no longer necessary and will be omitted.

A cell 18 comprises first and second electrical connection terminals 30, 32 that connect it electrically to the other cells and ultimately to the terminals 12, 14 of the battery 10. A cell 18 is also fixed mechanically, with no degree of freedom, to the other cells of the battery 10 to form what is often called a "pack" of cells. The cell 18 can store electrical energy when not being used. This stored electrical energy is then used to power the motor 4, which discharges the cell 18. Alternatively, the cell 18 can also receive electric energy, which charges it. The complete discharging of a cell followed by its complete recharging constitutes what is known as a charging/discharging cycle, or simply called in the following the "cycle of a cell." A typical cell 18 is a LiPB (Lithium-ion Polymer Battery). However, other known cell types can also be used.

The cell 18 is characterized by an initial nominal capacitance $C_n^{ini}$, an initial internal resistance $RO^{ini}$, a current flow $I_{max}$, a maximum voltage $U_{max}$, a minimum voltage $U_{min}$ and a function $OCV(SOC_k)$. The capacitance $C_n^{ini}$ is the initial capacitance of the cell 18. The capacitance of a cell represents the maximum quantity of electric energy that can be stored in that cell. This capacitance is expressed in Ah. As the cell 18 ages, i.e., as it sustains an increasing number of charging and discharging cycles, its capacitance decreases. At time k, the nominal capacitance of the cell 18 shall be denoted as $C_{n,k}$.

The initial internal resistance $RO^{ini}$ is the value of the internal resistance of the cell 18 before it begins to age. The internal resistance of a cell is a physical quantity that is found in most electrical models of an electrical cell. When the cell ages, typically the internal resistance increases. At time k, the internal resistance of the cell 18 is denoted $RO_k$.

$I_{max}$ is the maximum current that can be delivered by the cell 18 without it becoming damaged.

$U_{max}$ is the maximum voltage that may be present constantly between the first and second terminals 30, 32 of the cell without damaging it.

The voltage $U_{min}$ is the minimum voltage between the first and second terminals 30, 32 when the cell 18 is completely discharged. In the following, $I_{max}$, $U_{max}$, $U_{min}$ are constant.

The function $OCV(SOC_k)$ is a predetermined function that returns the no-load voltage of the cell 18 as a function of its state-of-charge $SOC_k$. The no-load voltage is the voltage measurable between the first and second terminals 30, 32 after the cell 18 has been electrically insulated from any electrical load for two hours.

The cell's state-of-charge at time k is denoted $SOC_k$. It is equal to 100% when the quantity of electric energy stored in the cell 18 reaches a limit set by its capacitance $C_{n,k}$. It is equal to 0% when the quantity of electric energy stored in the cell 18 is zero. When this happens, no electrical energy can be extracted from the cell 18 to energize an electrical load.

The parameters $C_n^{ini}$, $RO^{ini}$, $I_{max}$, $U_{max}$, $U_{min}$ and the function $OCV(SOC_k)$ are known parameters of the cell 18. These are usually provided by the cell's manufacturer or experimentally determined from measurements performed on the cell 18.

The battery 10 comprises, for each cell, a voltmeter 34 and an ammeter 36. The voltmeter 34 measures the voltage between the cell's terminals. The ammeter 36 measures the cell's charging or discharging current. To simplify FIG. 1, only one voltmeter 34 and one ammeter 36 are shown.

Unlike the different parameters of the cell 18 introduced above, the state-of-charge $SOC_k$ of the cell 18 is not something that can be measured. It needs to be estimated based on what can be measured. Carrying out such estimates is among the functions of a battery-management system 40.

The battery-management system 40 determines the battery's state-of-charge 10 as well as its state-of-health. It does so by estimating the state-of-charge and the state-of-health of each of the battery's cells 18. A cell's state-of-health at time k, which is denoted $SOH_k$, represents how much the cell has aged. In the embodiment described herein, the battery-management system 40 estimates state-of-health at a particular time k by measuring the cell's capacitance $C_{n,k}$ at time k and determines the ratio $C_{n,k}/C_n^{ini}$. Electrical connections between the battery-management system 40 and each voltmeter 34 and each ammeter 36 of the battery 10 permit the battery-management system 40 to acquire the measurements of voltage and current between the terminals of each cell.

The battery-management system 40 comprises a memory 42 and a programmable electronic computer 44 to execute instructions recorded in the memory 42. For this purpose, the memory 42 contains the necessary instructions for the execution of the methods of FIGS. 10 to 12 and/or FIG. 17. The memory 42 also contains the initial values of the different parameters needed to execute these methods.

Figure 2:
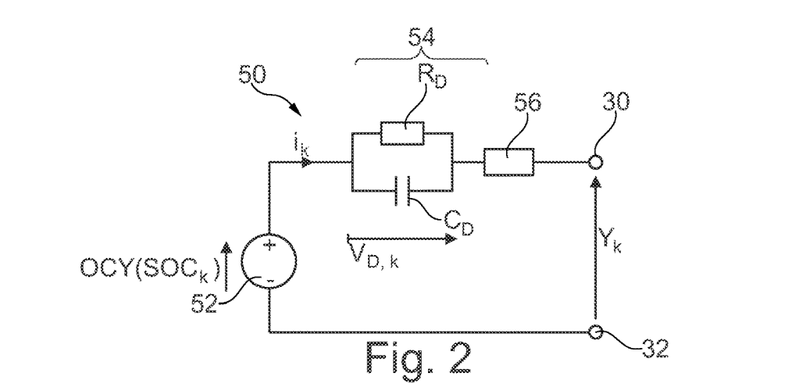
FIG. 2 is a schematic illustration of an electrical model of a cell of the battery of the vehicle of FIG. 1.

FIG. 2 represents an electrical model 50 of the cell 18. In some embodiments, the electrical model 50 is a first-order Thévenin model. In other embodiments, the electrical model 50 is a lumped parameter model. In either case, the electrical model 50 includes several components connected in series starting from the second terminal 32 and ending at the first terminal 30. These components include, in order starting at the second terminal 32, a generator 52 of no-load voltage $OCV(SOC_k)$, a parallel RC circuit 54, and an internal resistance 56, termed hereinafter, at time k, "internal resistance $RO_k$."

The parallel RC circuit 54 comprises a capacitor having capacitance $C_D$ connects in parallel to a resistor having resistance $R_D$, both of which are known and constant. The voltage at time k across the terminals of the parallel RC circuit 54 is denoted as $V_{D,k}$. At time k, the voltage between the cell's first and second terminals 30, 32 is $y_k$ and the cell's charging or discharging current is $i_k$.

Figure 3:
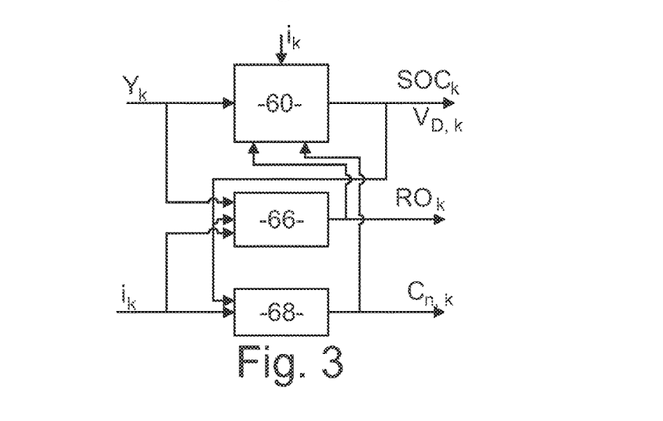
FIG. 3 is a schematic illustration of an arrangement of estimators used to estimate the state-of-charge of a cell of the battery of the vehicle of FIG. 1, FIGS. 4 to 9 represent equations of different state models and observation models used by the estimators of FIG. 3.

FIG. 3 represents an arrangement of first, second, and third estimators 60, 66, 68 implemented in the battery-management system 40 to estimate the cell's state-of-charge and its state-of-health. Each estimator 60, 66, 68 is implemented as an estimation algorithm executed by the computer. Thus, it is appropriate to speak hereinafter interchangeably of "the execution of an estimator" and "the execution of an estimation algorithm."

In this first embodiment, the battery-management system 40 has a first estimator 60 for estimating the state-of-charge $SOC_k$ and the voltage $V_{D,k}$ based on the measured value $y_k$ of the voltage and the measured current $i_k$. The first estimator 60 is implemented as a Kalman filter. It thus uses a state model 62, which is shown in FIG. 4, and an observation model 64, which is shown in FIG. 5.

Figure 4:
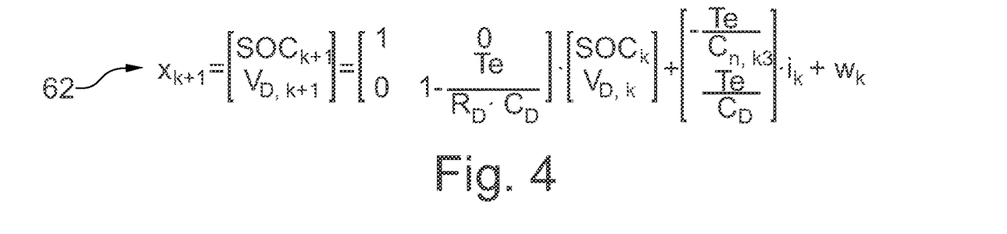
Figure 5:
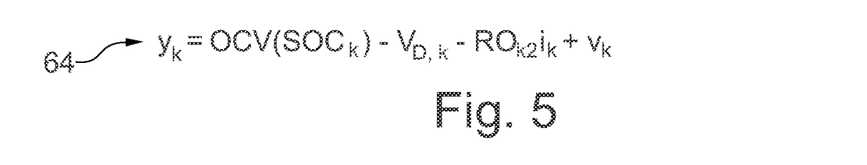

In FIGS. 4 and 5, the equations of the state model 62 and the observation model 64 are represented by using the previously defined notations. $RO_{k2}$ and $C_{n,k3}$ represent the capacitance and the internal resistance of the cell 18, respectively, at times k2 and k3. In the state model 62, $x_k$ denotes the state vector $[SOC_k, V_{D,k}]^T$ at time k, where the symbol "$T$" denotes the transpose of a matrix and the operator "." or "*" both represent multiplication.

In the following discussion, it is assumed that the temporal origin corresponds to k=0. In these conditions, the present time k is equal to $kT_e$, where $T_e$ is the sampling period for the measurements of the ammeters 36 and voltmeters 34 of the battery 10. Thus, $T_e$ is the period separating any two consecutive times k and k−1 at which the battery-management system 40 acquires a voltage and a current. The sampling period $T_e$ is typically a constant between 0.1 seconds and ten seconds. In the illustrated embodiment, the sampling period $T_e$ is equal to one second plus or minus 20%.

The state model 62 allows prediction of the state-of-charge $SOC_{k+1}$ at time k+1 from a preceding state-of-charge $SOC_k$. The observation model 64 allows prediction of the voltage $y_k$ at time k from the state-of-charge $SOC_k$, the voltage $V_{D,k}$ and the measured current $i_k$.

In the state model 62 shown in FIG. 4, $w_k$ is a state noise vector that represents centered Gaussian white noise. The state noise vector thus represents the uncertainty in the model. The covariance matrix at time k of the noise $w_k$ is denoted as $Q_k$, which is defined by $Q_k = E(w_k * w_k^T)$, where $E(\ldots)$ is the mathematical expectation function. The state model 62 is likewise written in the form $X_{k+1} = F_k X_k + B_k i_k + w_k$, where $F_k$ is the state transition matrix at time k, and $B_k$ is the control vector at time k.

In the observation model 64, which is shown in FIG. 5, $v_k$ is centered Gaussian white measurement noise. The covariance matrix $R_k$ of the noise $v_k$ at time k is a matrix of a single column and a single row. It is defined by the relation $R_k = E(v_k * v_k^T)$. This noise $v_k$ is independent of the noise $w_k$ and of the initial state vector $x_0$.

The observation model 64 is nonlinear because the function $OCV(SOC_k)$ is generally nonlinear. As a result, the first estimator 60 implements an extended version of the Kalman filter. This extended version results in a linear observation model of the form $y_k = H_k x_k + RO_{k2} \cdot i_k + v_k$ as a result of having linearized the observation model 64 in the neighborhood of the vector $x_k$. Typically, the observation model 64 is developed into a Taylor's series in the neighborhood of the vector $x_k$. Linearization occurs because contributions of the derivatives starting with the second order are ignored. The matrix $H_k$ is thus equal to the first derivative of the function OCV in the neighborhood of the state-of-charge $SOC_k$. This linearization of the observation model 64 is typically carried out for each new value of the state-of-charge $SOC_k$.

Referring back to FIG. 3, the first estimator 60 needs to know the cell's capacitance $C_{n,k3}$ and its internal resistance $RO_{k2}$ to be able to estimate the state-of-charge $SOC_{k+1}$. These vary as the cell 18 ages. To take this aging into account, the capacitance and the internal resistance of the cell 18 are estimated, respectively, at times k3 and k2. These estimates come from the second estimator 66 and the third estimator 68. The second estimator 66 estimates the internal resistance $RO_{k2}$ from the measured value $y_{k2}$, from the measured current $i_{k2}$, and from the state-of-charge $SOC_{k2}$. The third estimator 68 estimates the capacitance $C_{n,k3}$ from the current $i_{k3}$ and the state-of-charge $SOC_{k3}$.

A cell's internal resistance and its capacitance vary more slowly than its state-of-charge. Thus, to limit the computational resources needed to estimate the state-of-charge of the cell without thereby degrading the precision of this estimate, the second and third estimators 66, 68 are executed less frequently than the first estimator 60.

In what follows, the times of execution of the second and third estimators 66, 68 are denoted respectively as k2 and k3 to distinguish them from the times k. The set of times k2 and the set of times k3 are subsets of the set of times k. Thus, between two successive times k2 and k2−1 and between two successive times k3 and k3−1 there elapse several sampling periods $T_e$ and several sampling times k.

Figure 6:
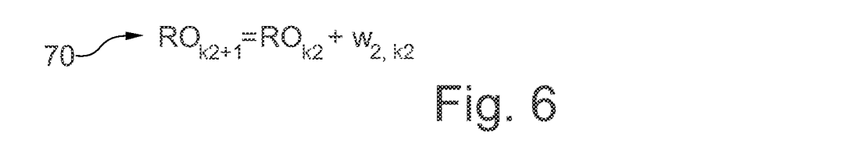
Figure 7:
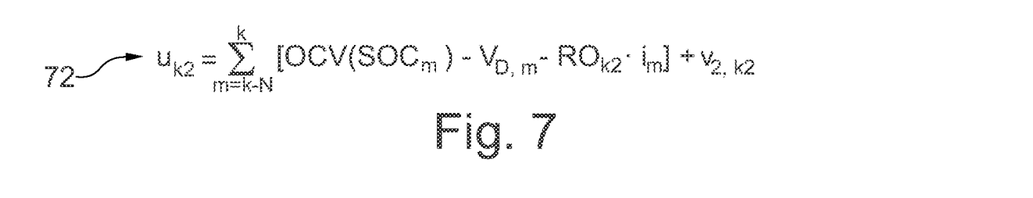

Like the first estimator 60, the second and third estimators 66, 68 are also implemented as Kalman filters. The second estimator 66 uses a state model 70 and an observation model 72. These are shown in FIGS. 6 and 7 respectively. In these models, the noises $w_{2,k2}$ and $v_{2,k2}$ are both centered Gaussian white noise. The covariances of the noises $w_{2,k2}$ and $v_{2,k2}$ are denoted respectively as $Q_{2,k2}$ and $R_{2,k2}$ in the following. The observation model 72 enables predicting the value of a directly measurable physical quantity $u_{k2}$. The physical quantity $u_{k2}$ is the sum of the last N measured values $y_k$, as defined by the following summation:

$$u_{k2} = \sum_{m=k-N}^{k} y_k$$

where N is a whole number greater than one that is counted as will be described below. In the above relation, and in the observation model 72, the time k is equal to the time k2.

The observation model 72 considers not only the state-of-charge $SOC_k$, the voltage $V_{D,k}$ and the current $i_k$ measured at time $k=k2$, but also the N previous estimates of the first estimator 60 and the N previous measured currents between the times k2 and k2−1. Considering the intermediate measurements and estimates between the times k2 and k2−1 makes it possible to increase the precision of the estimate of the internal resistance $RO_{k2}$.

Figure 8:
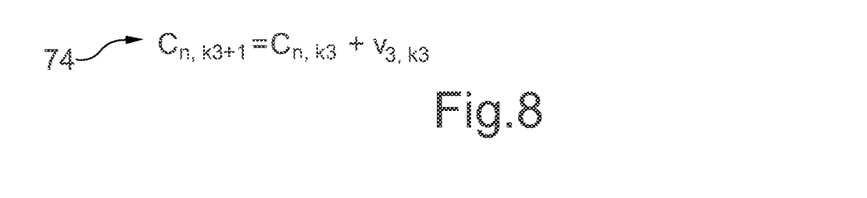
Figure 9:
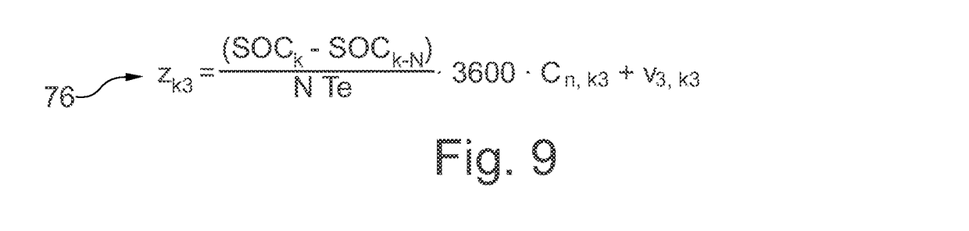

The third estimator 68 uses a state model 74 and an observation model 76, shown in FIGS. 8 and 9 respectively. In both the state model 74 and in the observation model 76, the noises $w_{3,k3}$ and $v_{3,k3}$ are centered Gaussian white noises. The covariances of the noises $w_{3,k3}$ and $v_{3,k3}$ are denoted respectively as $Q_{3,k3}$ and $R_{3,k3}$ in the following. The observation model 76 is a linear model. Therefore, a simple Kalman filter can be used for the third estimator 68 instead of an extended Kalman filter.

The observation model 76 permits estimation of a directly measurable physical quantity $z_{k3}$. The physical quantity $z_{k3}$ in this case is the sum of the last N measured currents $i_k$, as defined by the summation:

$$z_{k3} = \sum_{m=k-N}^{m=k-1} i_m$$

In the above relation, and in the observation model 76, the time k is equal to the time k3. The physical quantity $z_{k3}$ takes into account not only the current $i_{k-1}$ measured at time k−1 preceding time k3 but also the previous N currents measured between the times k3 and k3−1. N is a whole number greater than one that is counted as shall be described further below. It is not necessarily equal to the N introduced in the observation model 72. Considering intermediate measurements and estimates between the times k3 and k3−1 makes it possible to increase the precision of the estimate of the capacitance $C_{n,k3}$.

Figures 10, 11, 12:
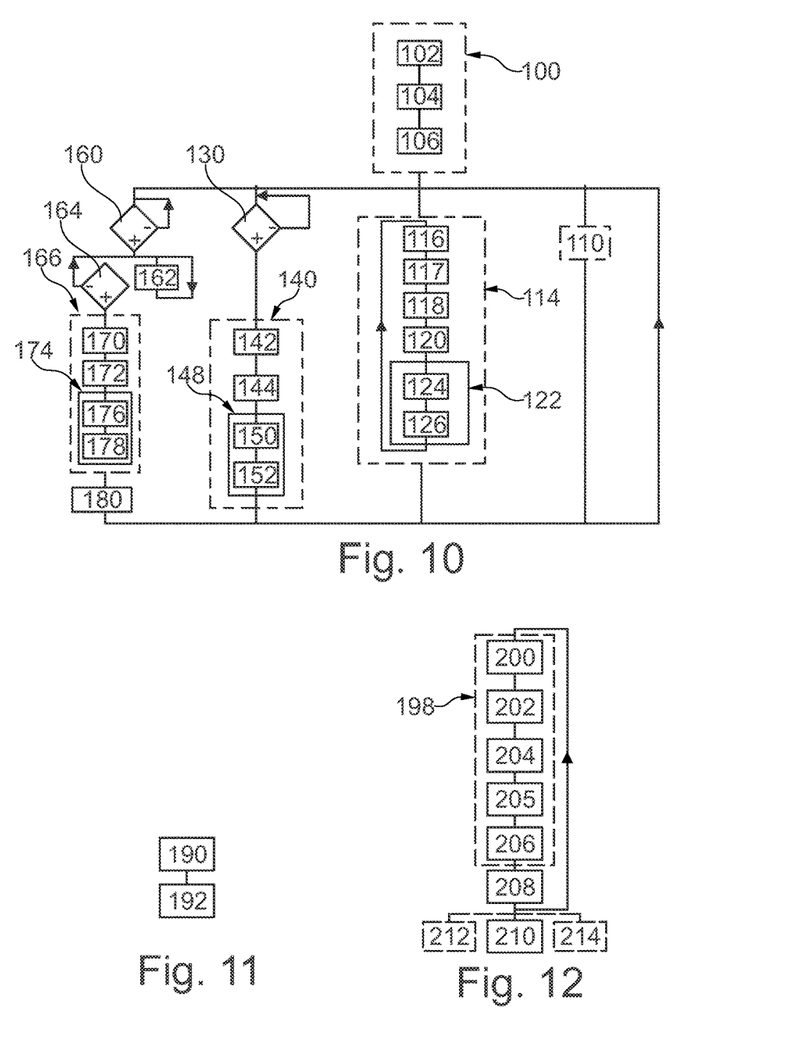
FIG. 10 is a flow chart of a method for estimating the state-of-charge of a cell using the estimators of FIG. 3.
FIG. 11 is a flow chart of a method for determining the state-of-charge of the battery of the vehicle of FIG. 1.
FIG. 12 is a flow chart of a method for scheduling the refresh times of the estimates of the states of charge of different cells of a battery.

Referring now to FIG. 10, a method for estimating a cell's state-of-charge starts with a first phase 100 for adjusting the different covariance matrices needed to execute the estimators 60, 66, 68. More precisely, during a first step 102 of the first phase 100, the covariance matrices $$G_{o,k}(N_o) = \sum_{i=0}^{N_o-1} (F_k^T)^i H_k^T H_k (F_k)^i$$

$Q_k$ and $R_k$ of the first estimator 60 are automatically adjusted with the aid of the following relations: $Q_k=[N_0 G_{0,k}(N_0)]^{-1}$ and $R_k=I$, where: $N_0$ is a predetermined whole number greater than 1, I is the identity matrix, and $G_{0,k}(N_0)$ is defined by the following relation:
where $N_0$ is generally chosen during the design of the battery-management system 40 and then set once and for all. Generally, $N_0$ is less than 100. In many cases, $N_0$ is between 5 and 15. In the illustrated embodiment, $N_0$ is chosen equal to 10.

Using the preceding relations considerably simplifies the adjustment of the matrices $Q_0$ and $R_0$ as well as the adjustment of the matrices $Q_k$ and $R_k$ as shall be seen in the following. In fact, the only parameter to be chosen is the value of the integer $N_0$.

During a second step 104 of the first phase 100, the covariances $Q_{2,0}$ and $R_{2,0}$ are also adjusted. In some practices, $Q_{2,0}$ is equal to $[(\beta*RO^{ini})/(3*N^c_{eol}*N_S)]^2$, where: β is a constant greater than or equal to 0.3 or 0.5 and preferably greater than 0.8 and generally less than three. $N^c_{eol}$ is the predicted number of charging and discharging cycles the cell 18 has left before it reaches its end of life, and $N_S$ is the number of times that the internal resistance is estimated per charging and discharging cycle of the cell 18.

The constant β, expressed in percentage divided by 100, represents the difference between the value of the initial internal resistance $RO^{ini}$ and its end of life value. Typically, β is set by the user or measured experimentally. $N^c_{eol}$ is a number of cycles that can be measured experimentally or obtained from data provided by the cell's manufacturer. $N_S$ is set by the method of estimation of the state-of-charge implemented by the battery-management system's computer 44. In this embodiment, as we shall see below, the internal resistance is estimated once per cycle. Consequently, $N_S$ is taken to be equal to 1.

In some practices, the covariance $R_{2,0}$ is chosen to be equal to $(2\varepsilon_m U_{max}/300)^2$, where $\varepsilon_m$ is the maximum error of the voltmeter 34 expressed in percentage.

Afterwards, the covariances $Q_{2,k2}$ and $R_{2,k2}$ are considered to be constant and equal respectively to $Q_{2,0}$ and $R_{2,0}$.

During a third step 106 of the first phase 100, the covariances $Q_{3,0}$ and $R_{3,0}$ are adjusted. For example, the covariance $Q_{3,0}$ is taken to be equal to $[\gamma*C_n^{ini}/(3*N^c_{eol}*N_S)]^2$, where γ, expressed in percentage divided by 100, represents the difference between the capacitance $C_n^{ini}$ and the capacitance of the cell 18 at the end of life. γ is a constant chosen by the user to be between 0.05 and 0.8, and preferably between 0.05 and 0.3. In the embodiment described herein, γ=0.2.

In the embodiment described herein, the covariance $R_{3,0}$ is equal to $[2*\varepsilon_{im}*I_{max}/300]^2$, where $\varepsilon_{im}$ is the maximum error of the ammeter 36 expressed in percentage.

Afterwards, the covariances $Q_{3,k3}$ and $R_{3,k3}$ are considered to be constant and equal respectively to $Q_{3,0}$ and $R_{3,0}$.

Once the covariance matrices have been adjusted, a third phase 110 commences the estimation of the cell's state-of-charge.

During the third phase 110, at each time k, the voltmeter 34 and the ammeter 36 measure, respectively, the value $y_K$ and the current $i_k$. The battery-management system 40 immediately acquires these measurements and records them in the memory 42. The third phase 110 repeats at each time k.

In parallel with the third phase 110, the first estimator 60 executes a second phase 114 during which it estimates the cell's state-of-charge at time k.

The second phase 114 begins with a first step 116 in which the first estimator 60 calculates a prediction $\hat{SOC}_{k/k-1}$ of the cell's state-of-charge and a prediction $V_{D,k/k-1}$ of the voltage $V_D$ at the terminals of the parallel RC circuit 54 at time k. As used herein, the index k/k−1 indicates an a priori prediction at time k, and the index k/k indicates an a posteriori prediction at time k. An a priori prediction considers only measurements made between the times 0 and k−1. An a posteriori prediction considers all the measurements made between the times 0 and k.

The predictions $\hat{SOC}_{k/k-1}$ and $V_{D,k/k-1}$ are calculated with the aid of the state model 62 from the measured current $i_{k-1}$ and the capacitance $C_{n,k3}$. It will be noted that, in the state model 62, the state transition matrix $F_{k-1}$ is constant regardless of k. Therefore, there is no need to re-evaluate it at each time k.

During a second step 117 of the second phase 114, the first estimator 60 calculates the prediction $P_{k/k-1}$ of a covariance matrix for the error of estimation on the state vector $x_k$. Typically, this is done with the aid of the relation: $P_{k/k-1} = F_{k-1} P_{k-1/k-1} F_{k-1}^T + Q_{k-1}$. The various matrices $F_{k-1}$, $P_{k-1/k-1}$ and $Q_{k-1}$ have already been defined previously.

In a third step 118 of the second phase 114, the first estimator 60 constructs the matrix $H_k$ by linearizing the observation model 64 around the predictions $\hat{SOC}_{k/k-1}$ and $V_{D,k/k-1}$.

During a fourth step 120 of the second phase 114, the covariance matrices $Q_k$ and $R_k$ are automatically updated. The fourth step 120 of the second phase 114 is identical to the first step 102 of the first phase 100, this time considering the matrix $H_k$ constructed during third step 118 of the second phase 114.

After this, during a fifth step 122 of the second phase 114, the first estimator 60 corrects the predictions $\hat{SOC}_{k/k-1}$ and $V_{D,k/k-1}$ as a function of a difference between the measured value $y_k$ and a value $\hat{y}_k$ predicted from the observation model 64. The fifth step 122 of the second phase 114 typically involves a first operation 124 and a second operation 126. The first operation 124 of the fifth step 122 calculates the prediction $\hat{y}_k$. Then, the second operation 126 of the fifth step 122 corrects the predictions $\hat{SOC}_{k/k-1}$ and $V_{D,k/k-1}$ and the matrix $P_{k/k-1}$ to obtain the corrected predictions $\hat{SOC}_{k/k}$, $V_{D,k/k}$ and $P_{k/k}$.

During the first operation 124 of the fifth step 122, the prediction $\hat{y}_k$ is calculated with the aid of the observation model 64 in which the value of the state-of-charge is taken to be equal to $\hat{SOC}_{k/k-1}$ and the value of the voltage $V_{D,k}$ is taken to be equal to $V_{D,k/k-1}$. The difference between the measured value $y_k$ and its prediction $\hat{y}_k$ is henceforth denoted as $E_k$.

There are many methods for correcting the a priori estimates $\hat{SOC}_{k/k-1}$ and $V_{D,k/k-1}$ based on the difference $E_k$. For example, during the second operation 126 of the fifth step 122, these estimates are corrected with the help of the Kalman gain $K_k$. The Kalman gain $K_k$ is given $K_k = P_{k/k-1} H_k^T (H_k P_{k/k-1} H_k^T + R_k)^{-1}$. The a priori predictions are then corrected with the help of the following relation: $x_{k/k} = x_{k/k-1} \pm K_k E_k$.

The matrix $P_{k/k-1}$ is corrected with the help of the following relation: $P_{k/k} = P_{k/k-1} - K_k H_k P_{k/k-1}$.

The first through fifth steps 116, 117, 118, 120, 122 of the second phase 114 are repeated at each time k when a new estimate of the cell's state-of-charge is needed. During each new iteration, the state vector $x_{k-1}$ is initialized with the values obtained during the preceding iteration of second phase 114 for the cell 18.

In parallel, during a first comparison step 130 the battery-management system's computer 44 compares each new measurement of the current $i_k$ to a predetermined current threshold $SH_i$. As long as the measured current does not pass the threshold $SH_i$, the execution of the second estimator 66 is inhibited. Conversely, once the measured current $i_k$ crosses this threshold $SH_i$, the second estimator 66 is immediately executed. The threshold $SH_i$ is generally greater than $I_{max}/2$ and advantageously greater than $0.8*I_{max}$ or $0.9*I_{max}$.

The second estimator 66 executes a fourth phase 140 in which it estimates the internal resistance $RO_{k2}$ at time k2. In this case, the time k2 is equal to the time k when the current $i_k$ crosses the threshold $SH_i$.

During a first step 142 of the fourth phase 140, the second estimator 66 calculates the a priori prediction $\hat{RO}_{k/k-1}$ of the internal resistance from the state model 70.

Next, during a second step 144 of the fourth phase 140, the second estimator 66 calculates the prediction $P_{2,k2/k2-1}$ of the covariance matrix of the error of estimation for the internal resistance. For example, this prediction is calculated with the help of the following relation: $P_{2,k2/k2-1} = P_{2,k2-1/k2-1} + Q_{2,0}$. It will be noted that the observation model 72 here is a linear function of the variable of state. Thus, it is not necessary to linearize it in the neighborhood of the prediction $\hat{RO}_{k2/k2-1}$ to obtain the matrix $H_{2,k2}$. In the particular case described herein, this matrix $H_{2,k2}$ is equal to $-N$.

During a third step 148 of the fourth phase 140, the second estimator 66 corrects the prediction $\hat{RO}_{k2/k2-1}$ as a function of the difference between the measured physical quantity $u_{k2}$ and a prediction $\hat{u}_{k2}$ of this same physical quantity. N is a predetermined constant chosen absolutely to be greater than one, and preferably greater than 10 or 30. The quantity $u_{k2}$ is acquired by the second estimator 66 as the values $y_k$ are measured and acquired.

More precisely, during a first operation 150 of the third step 148 of the fourth phase 140, the computer 44 acquires the measured quantity $u_{k2}$ and calculates the prediction $\hat{u}_{k2}$. The acquisition of the quantity $u_{k2}$ is done by adding up the last N measurements of the measured value $y_k$. The prediction $\hat{u}_{k2}$ is calculated with the help of the observation model 72. In this observation model 72, the value $RO_{k2}$ is taken to be equal to the previously calculated value $RO_{k-2/k2-1}$.

Next, during a second operation 152 of the third step 148 of the fourth phase 140, the second estimator 66 corrects the prediction $\hat{RO}_{k2/k2-1}$ as a function of the difference $E_{k2}$. The difference $E_{k2}$ is equal to the difference between the measured quantity $u_{k2}$ and the predicted quantity $\hat{u}_{k2}$. In some practices, the second operation 152 of the third step 148 of the fourth phase 140 uses the same method employed during the second operation 126 of the fifth step 122 of the second phase 114. Thus, the second operation 152 is not described in further detail. The new estimate $RO_{k2/k2}$ is then used during the following executions of the first estimator 60 in place of the previous estimate $RO_{k2-1/k2-1}$.

Triggering the second estimator 66 only when the measured current $i_k$ is elevated permits increasing the precision of the estimate of the internal resistance while at the same time reducing the computational resources needed to carry out the procedure. This also results in a synergistic effect because it so happens that the measurement precision of the ammeter will be higher anyway when the current $i_k$ is more elevated.

The method also includes a second comparison step 160 that is in parallel with the second phase 114 and with the third phase 110. During the second comparison step 160, at each time k, the estimate $SOC_k$ is compared to a predetermined upper threshold $SH_{soc}$. If the estimate $SOC_k$ falls below this threshold $SH_{soc}$, then the method continues immediately with a counting step 162 and a third comparison step 164. Otherwise, the second comparison step 160 is repeated at the next time k. Typically, the threshold $SH_{soc}$ lies between 90% and 100%.

During the counting step 162, the computer 44 begins by initializing a counter at zero and then increments it by 1 at each new measurement of the current $i_k$ since the start of the counting step 162. Moreover, at each time k, the measured current $i_k$ and the estimate $SOC_k$ generated at the same time are recorded and associated with the relevant time k in a database.

In parallel with the counting step 162, during a third comparison step 164 the computer 44 compares each new estimate $SOC_k$ to a predetermined threshold $SL_{soc}$. The threshold $SL_{soc}$ for example lies between 0% and 10%. As long as the estimated $SOC_k$ remains higher than this threshold $SL_{soc}$, the counting step 162 is repeated at the following time k. Otherwise, as soon as the estimate $SOC_k$ for the cell 18 falls below this threshold $SL_{soc}$, the computer 44 triggers at once the execution of the third estimator 68 and stops incrementing the counter. Thus, as long as this threshold $SL_{soc}$ has not been crossed, the execution of the third estimator 68 is inhibited.

The third estimator 68 estimates, during a fifth phase 166, the capacitance $C_{n,k3}$ at time k3. Thus, time k3 is equal to time k when the execution of the third estimator 68 is triggered.

As was the case for the fourth phase 140, given that the third estimator 68 is not executed at each time k, the time k3−1 does not correspond to the time k−1. On the contrary, the times k3 and k3−1 are separated by an interval of time greater than or equal to $NT_e$ where N is the number counted during the counting step 162.

The parameters of the third estimator's Kalman filter are initialized with the previous values of these parameters obtained at the end of the previous iteration at time k3−1 of the fifth phase 166. The fifth phase 166 involves first, second, and third steps 170, 172, 174.

The first step 170 of the fifth phase 166 includes calculating the prediction $C_{n,k3/k3-1}$ with the help of the state model 74. The second step 172 of the fifth phase 166 includes calculating the prediction $P_{3,k3/k3-1}$ of the covariance matrix of the error of the estimate of the capacitance. And the third step 174 of the fifth phase 166 includes correcting the predictions $C_{n,k3/k3-1}$ and $P_{3,k3/k3-1}$.

During the first step 172 and the third step 174 of the fifth phase 166, the matrix of observability $H_{3,k3}$ is equal to $[(SOC_k-SOC_{k-N})]*3600/(NT_e)$. N is the number of times k elapsed between the time when the estimated state-of-charge has dropped below the threshold $SH_{soc}$ and the time when the estimated state-of-charge has dropped below the threshold $SL_{soc}$. The value of N is equal to the value counted during the counting step 162.

The third step 174 of the fifth phase 166 includes a first operation 176 and a second operation 178.

The first operation 176 of the third step 174 of the fifth phase 166 is that of acquiring the measured physical quantity $z_{k3}$ and calculation of the prediction $\hat{z}_{k3}$ of the quantity $z_{k3}$. Acquiring the quantity $z_{k3}$ includes calculating the sum of the last N currents measured between times k−1 and k−N. The prediction $\hat{z}_{k3}$ is obtained from the observation model 76.

Next, during the second operation 178 of the third step 174 of the fifth phase 166, the third estimator 68 corrects the prediction $C_{n,k3/k3-1}$ as a function of the difference between the measured quantity $z_{k3}$ and the predicted quantity $\hat{z}_{k3}$ to obtain the a posteriori estimate of the capacitance $C_{n,k3/k3}$. This correction is done for example as described during the second operation 126.

Next, the capacitance $C_{n,k3/k3}$ is sent to the first estimator 60, which then uses it to estimate the state-of-charge of the cell 18 at subsequent times.

Triggering execution of the third estimator 68 only after the cell 18 has been discharged increases the precision of the estimate while concurrently decreasing the computational load associated with carrying out this method.

Following the end of the fifth phase 166, during a calculation step 180, the computer calculates the state-of-health $SOH_{k3}$ at time k3 with the help of the formula: $SOH_{k3}=C_{n,k3}/C_n^{imi}$.

FIG. 11 represents a method of determining the battery's state-of-charge. At time k, the state-of-charge of the battery 10 is determined from the state-of-charge of each of the cells of this battery. For example, this is done in the following way. During a first determining step 190, the computer 44 determines the state-of-charge of each stage of the battery by adding up the states-of-charge of each cell of this stage. Next, during a second determining step 192, the battery's state-of-charge is taken to be equal to the smallest of the states-of-charge of a stage as determined during the first step 190.

As illustrated by the method of FIG. 11, the determination of the battery's state-of-charge at each time k requires having only an estimate of the state-of-charge for each of the cells at time k. A first solution thus includes executing in parallel, for each of the cells, the estimation method of FIG. 10 by executing the second phase 114 at each time k. However, to limit the required computational resources without degrading the precision of the state-of-charge determined for the battery, it is also possible to schedule the execution of the estimates of the states of charge of the cells as described in connection with the scheduling method of FIG. 12.

The scheduling method of FIG. 12 is described in a simplified case in which there are only three priority levels: an elevated priority level, a medium priority level, and a low priority level. In the example described herein, the state-of-charge of a cell whose priority level is elevated needs to be estimated at each time k and thus at a frequency $f_e$. The state-of-charge of a cell whose priority level is medium only needs to be estimated with a frequency of one third of this, and thus at a frequency $f_e/3$. Finally, the state-of-charge of the cells of low priority level needs to be estimated at a frequency of one tenth of this and thus at a frequency $f_e/10$. In this example, for the elevated and medium priority levels there are a limited number of places known in advance. In other words, the number of cells assigned to the elevated priority level is limited to the maximum number predetermined in advance. The same holds for the number of cells assigned to the medium priority level.

To schedule the times at which the estimates of the state-of-charge of each of the cells need to be refreshed, the computer begins by assigning, during a first scheduling step 198, a priority level to each cell.

The first scheduling step 198 starts with a first scheduling operation 200 during which the battery-management system 40 acquires the measured value $y_k$ of the voltage between the terminals of each of the cells.

The first scheduling step 198 then proceeds with a second scheduling operation 202. During this second scheduling operation 202, if the measured value $y_k$ is above an upper threshold $SH_y$ or, on the other hand, below a lower threshold $SL_y$, the computer 44 then assigns to this cell the elevated priority level as long as there remain enough places in this level. The upper threshold $SH_y$ is greater than or equal to $0.9*U_{max}$ and, preferably, greater than $0.95*U_{max}$. The lower threshold $SL_y$ is greater than or equal to $U_{min}$, and less than $1.1*U_{min}$, or in some practices, $1.05*U_{min}$. It is important to frequently refresh the estimate of the state-of-charge of the cells whose voltage is close to $U_{max}$ or close to $U_{min}$. In fact, an error in the estimate of the state-of-charge of a cell in such a situation may lead to a degradation of the electrical and mechanical properties of that cell.

The first scheduling step 198 then proceeds with a third scheduling operation 204. During the third scheduling operation 204, the computer 44 calculates the difference in voltage between the current measured value $y_k$ and a previous value $y_{k-x}$, where X is a predetermined whole number greater than or equal to one and generally less than 5 or 10. In the embodiment described herein, X=1.

The first scheduling step 198 then proceeds with a fourth scheduling operation 205 during which the computer 44 identifies twin cells. Cells are "twins" if, at the same time k, they have the same voltage difference and the same measured value $y_k$. For this, during the fourth scheduling operation 205 the computer 44 compares the voltage difference and the measured value $y_k$ for one cell to the voltage differences and the measured values $y_k$ for the other cells at the same time to identify among these other cells one or more twin cells for this cell. The identifier of this cell and the identifiers of its twins are then grouped into a set, which is recorded in the memory 42. The above comparison is carried out, for example, for each of the cells of the battery 10 whose identifier has not already been incorporated into one of the sets of twin cells so recorded. Afterwards, a priority level is assigned to only one of the cells of each set of twin cells. Thus, a fifth scheduling operation 206 and second and third steps 208, 210 are performed only for those cells that either do not have any twin cell or to a selected representative cell from each set of twin cells.

The first scheduling step 198 then proceeds with the fifth operation 206, during which the computer sorts the cells in decreasing order of the absolute value of the difference calculated during the third operation 204. For each cell, it assigns a priority level to that cell based on where that cell falls within the sorted cells. In particular, it assigns, to the first cells of the sorted cells, the remaining places associated with elevated priority levels. It then assigns the remaining places associated with a medium priority level to the next cells in these sorted cells. Finally, it assigns to the last cells of the sorted cells to the low priority level.

Once a priority level has been assigned to each cell, the scheduling method of FIG. 12 proceeds with its second scheduling step 208. During the second scheduling step 208, the computer 44 schedules the refresh times for the estimates of the states-of-charge of the cells as a function of their priority level. The second scheduling step 208 is carried out to obey the refresh frequency for the estimates that is associated with each of the priority levels. For this, for example, the computer 44 first reserves the times at which the estimates of the cells of elevated priority level need to be refreshed. Next, it reserves the times at which the estimates of the state-of-charge of the cells of medium priority level need to be refreshed, considering the refresh times already reserved. Finally, it does the same with the cells assigned a low priority level.

To illustrate this, assume that an elevated priority level has been assigned to a first cell 18, a medium priority level has been assigned to second and third cells 19, 20, and a low priority level has been assigned to a fourth cell 21. Furthermore, assume that during a period $T_e$ the computer executes second phase 114 of the method of FIG. 10 at most twice. The result obtained with these assumptions is represented in FIG. 13.

Figure 13:
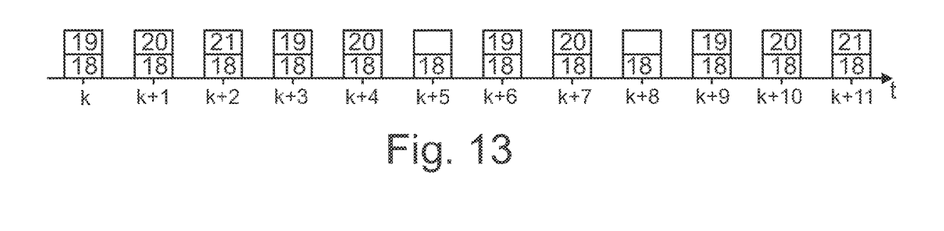
FIG. 13 is a flow chart illustrating different scheduled refresh times with the aid of the method of FIG. 12.

In FIG. 13, the times k to k+11 have been plotted along the x-axis. Above each of these times k, two boxes symbolize the fact that the computer 44 may, at each time k, execute the second phase 114 of the method of FIG. 10 twice. In each of these boxes, the number of the cell for which second phase 114 is executed has been indicated. When no number appears in this box, it means that the method of FIG. 10 was not executed and thus the computational resources saved can be used for other purposes, such as, for example the execution of the second and third estimators 66, 68.

Finally, during a third scheduling step 210, for each cell assigned a priority level the computer 44 executes second phase 114 at the scheduled time for this cell. Outside of these scheduled times, the computer inhibits the full execution of second phase 114 for this cell. Likewise, the execution of second phase 114 for the twin cells to which no priority level has been assigned is also inhibited.

In parallel, during a fourth scheduling step 212, for each twin cell having no priority level assigned to it, the estimate of the state-of-charge of this cell is taken to be equal to the last estimate calculated during the third scheduling step 210 as carried out for a twin of this cell. Thus, second phase 114 is executed for only one of the twin cells. This makes it possible to reduce the computational resources needed to determine the state-of-charge of the battery without degrading the precision of this determination.

Optionally, in parallel with third scheduling step 210, at each time k the computer 44 also executes a fifth step 214 during which it predicts the state-of-charge for each of the cells that were not processed during the third scheduling step 210 at time k. The fifth scheduling step 214 consists of executing only the first step 116 of the second phase 114 without executing the fifth step 122 of the second phase 114 for all the cells for which at the same time the full estimate second phase 114 was not executed.

It turns out that the first step 116 of the second phase 114 is much less hungry for computational resources than the fifth step 122 of the second phase 114. Because of this, it is not so costly to execute this first step 116 more frequently, for example, at each time k. Thus, when the fifth scheduling step 214 is carried out, one will have, at every time k, a new estimate of the state-of-charge for each of the cells of the battery.

The first scheduling step 198 and the second scheduling step 208 are repeated at regular intervals to update the priority level assigned to each of these cells and thus the refresh frequencies for the estimate of the state-of-charge of these cells. This method of scheduling the refresh times for the estimates of the states-of-charge of the cells makes it possible to limit the computational resources required without thereby degrading the precision of the battery's estimated state-of-charge. The scheduling method of FIG. 12 thus exploits the fact that the cells whose voltage differences are low are likely to be cells that are seldom discharged or charged. From this, one can infer that, for those cells, the state-of-charge does not change rapidly. Since the state-of-charge of those cells is not changing rapidly anyway, it becomes possible to estimate the state-of-charge of those cells at a lower frequency without significantly degrading the estimate of the battery's state-of-charge During the execution of the methods of FIGS. 10 and 11, each time that the state-of-charge $SOC_k$ of a cell at a given time needs to be used for a calculation, the state-of-charge $SOC_k$ is taken to be equal to the last state-of-charge estimated or predicted for that cell. In other words, it is considered that the state-of-charge remains constant between two successive times when it is estimated or predicted.

It will likewise be noted that, whenever the computer 44 executes the second phase 114 for a cell, it retrieves the necessary information for this execution from values obtained at the end of the previous execution of the second phase 114 for the same cell. This is the case for the state variables, for example. It will be noted, however, that the time of previous execution is then not necessarily the time k−1. It could be k−3 or k−10 depending on the priority level assigned to this cell.

Figure 14:
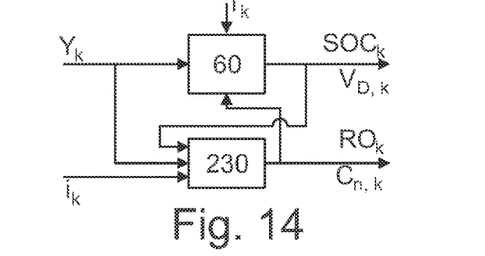
FIG. 14 is a schematic illustration of another arrangement of estimators used to estimate the state-of-charge of a cell of the battery of the vehicle of FIG. 1.

Many other embodiments of the method of estimation of the state-of-charge of a cell are possible, one of which is shown in FIG. 14.

FIG. 14 shows an alternative arrangement of estimators that is identical to that shown in FIG. 3 except that the second and third estimators 66, 68 have been replaced by a single estimator 230, which is executed less frequently than the first estimator 60. The single estimator 230 simultaneously estimates the capacitance and the internal resistance of the cell 18. For this example, k4 represents a set of times at which the single estimator 230 is to be executed. The values of the capacitance $C_{n,k4}$ and the internal resistance $RO_{k4}$ are thus estimated only at the set of times k4. The set of times k4 is a subset of the set of times k.

Figure 15:
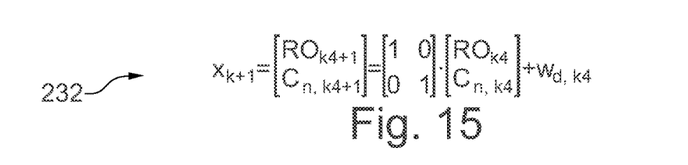
FIGS. 15 and 16 represent, respectively, a state model and an observation model used by the estimators of FIG. 14.
Figure 16:
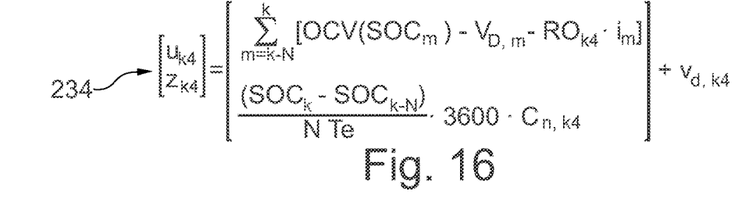

The single estimator 230 estimates the capacitance $C_{n,k4}$ and the internal resistance $RO_{k4}$ at the same time. It does so by implementing a Kalman filter that uses a state model 232 and an observation model 234 as shown in FIGS. 15 and 16 respectively.

Figure 17:
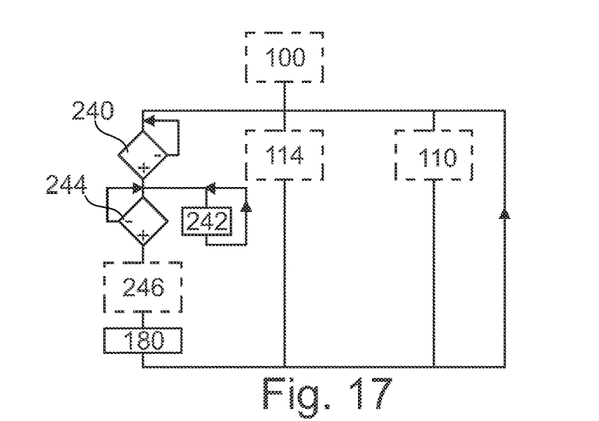
FIG. 17 is a flow chart of a method for estimation of the state-of-charge of a cell with the aid of the estimators of FIG. 14.

The functioning of this single estimator 230 shall now be described in connection with the method of FIG. 17 and in the case of the cell 18. This method of FIG. 17 is identical to the method of FIG. 10 except that the steps beginning with the first comparison step 130 up to and including the third step 174 of the fifth phase 166 have been replaced by an alternative first comparison step 240, an alternative counting step 242, an alternative second comparison step 244 and an estimation phase 246 for estimation of the capacitance and the internal resistance.

During step the alternative first comparison step 240, the computer 44 at each time k compares the measured value $y_k$ to an upper threshold $SH_{y2}$. Typically, this threshold $SH_{y2}$ is greater than or equal to $0.8*U_{max}$ or $0.9*U_{max}$. The alternative counting step 242 and the alternative second comparison step 244 are executed only if the measured value $y_k$ drops below this threshold $SH_{y2}$.

During the alternative counting step 242, the computer 44 begins by initializing a counter at zero and then increments this counter by 1 at each new time k. Moreover, at each of these times k the measured current $i_k$, the value $y_k$, the state-of-charge $SOC_k$ and the estimated voltage $V_{D,k}$ are recorded in a database and associated with this time k.

In parallel with the alternative counting step 242, during the alternative second comparison step 244, the computer 44 compares, at each time k, the new measured value $y_k$ with a lower voltage threshold $SL_{y2}$. The lower voltage threshold $SL_{y2}$ is less than or equal to $1.2*U_{min}$ or $1.1*U_{min}$ and greater than or equal to $U_{min}$.

Once the measured value $y_k$ drops below the lower voltage threshold $SL_{y2}$, the incrementing of the counter during step the alternative counting step 242 is halted and the execution of the single estimator 230 is triggered. On the other hand, as long as the measured value $y_k$ remains above the lower voltage threshold $SL_{y2}$, the execution of the single estimator 230 is inhibited.

The single estimator 230 executes the estimation phase 246. As before, the times $k_4$ and $k_4-1$ are separated by an interval of time greater than or equal to $NT_e$, where N is the value of the counter as incremented during the alternative counting step 242. The functioning of the single estimator 230 can be inferred from the functioning previously described for the estimators 66, 68. Thus, it will not be described here in further detail.

Other electrical models, and thus other state models, can be used to estimate the cell's state-of-charge. For example, a simplified practice omits the parallel RC circuit 54 altogether. On the other hand, a more complex electrical model may contain several parallel RC circuits electrically connected in series with each other. The cell's state model should thus be modified therefore to correspond to this new electrical model of the cell. However, the procedures described above apply with no difficulty to such a modified state model. Examples of modified state models can be found in international patent application WO2006057468, the contents of which are herein incorporated by reference.

The parameters $R_D$ and $C_D$ of the electrical model 50 can also be estimated instead of being predetermined constant parameters. For this purpose, the two parameters $R_D$ and $C_D$ are introduced into the state vector $x_k$, which then becomes $[SOC_k, V_{D,k}, R_{D,k}$ and $C_{D,k}]^T$. For example, the state model is then modified to incorporate the following two equations $R_{D,k+1}=R_{D,k}$ and $C_{D,k+1}=C_{D,k}$.

The state vector $x_k$ can also be supplemented by the cell's temperature. This permits concurrent estimation of the cell's temperature and its state-of-charge.

The cell may also be outfitted with supplemental sensors, such as a temperature sensor. In this case, the observation model is modified to take account these supplemental measured physical quantities. Examples of modified observation models are found in international patent application WO2006057468.

Other possible electrical models to simulate the electrical cell are also presented in part 2 of *Plett* 2004, in chapter 3.3.

The automatic continual adjustment of the covariance matrices $R_k$ and $Q_k$ can be done in a different way. One example is based on covariance matching, as described in Mehra, R. K: "On the identification of variances and adaptive Kalman Filtering", Automatic Control, IEEE Transaction on, Volume 15, No. 2, pages 175-184, April 1970. This method is applied after an initial setup of the matrices $R_0$ and $Q_0$, for example, as carried out during the first step 102 of the first phase 100.

In another practice of the method, the matrices $Q_0$, $R_0$, $Q_k$ and $R_k$ are not adjusted as described in connection with the first step 102 of the first phase 100 and the fourth step 120 of the second phase 114. In these alternative practices, these matrices are adjusted by carrying out a conventional method. In a simplified case, they are constant. For example, the matrix $R_0$ is then set up using data provided by the manufacturer of the sensors or based on tests performed on these sensors, and the matrix $Q_0$ by consecutive tests.

The fifth step 122 of the second phase 114 in FIG. 10 or the second operation 178 of the third step 174 of the fifth phase 166 for correction of the prediction can be done differently. For example, in one preferred method, the correction of the prediction of the state-of-charge and the voltage $V_{D,k}$ is done by minimizing a quadratic cost function J. This cost function J has two terms: a first term linked to the error of prediction of the measured value, and a second term linked to the error of estimation of the state vector.

This method is described in detail in chapter 10.5.2 of the following book: Y. Bar-Shalom, et al.: "Estimation With Applications to Tracking and Navigation, Theory Algorithms and Software", Wiley Inter-science, 2001.

In another variant, the first estimator 60 is not implemented in the form of a Kalman filter. For example, the state-of-charge is estimated by simulating its development over the course of time in the form of an IIR (Infinite Impulse Response) filter whose coefficients are estimated by the RLS (Recursive Least Square) method.

Other models of state can be used to estimate the internal resistance and the capacitance of the cell. For example, the model 232 can be replaced by a model 250, represented in FIG. 18. In the model 250, α, β and γ are constants whose values are obtained from cell manufacturer data or measured experimentally. Typically, α is equal to 1 plus or minus 30% or 10%, β is also equal to 1 plus or minus 30% or 10%, and γ is typically between 0.1 and 0.5. For example, γ is equal to 0.2 plus or minus 30% or 10%.

Figure 18:
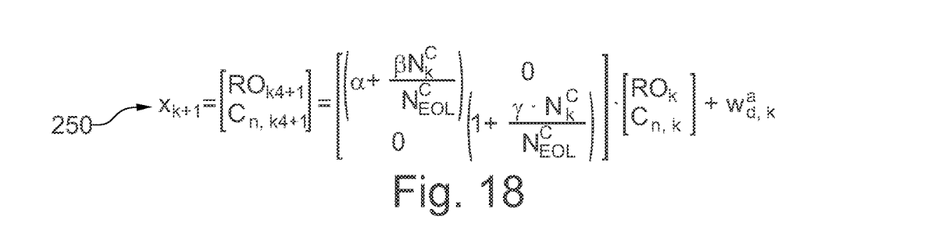
FIG. 18 is an illustration of another possible model of state for predicting the internal resistance and capacitance of a cell of a battery.

In the model 250, $N^c_k$ is equal to the number of charging/discharging cycles of the cell performed prior to the time k. This number of cycles is measured for example by counting the number of times that the state-of-charge of the cell drops below the upper threshold $SH_{soc}$ then below the lower threshold $SL_{soc}$. $w^a_{d,k}$ is centered Gaussian white noise. γ is the difference, expressed in percentage divided by 100, between the initial capacitance $C_n^{ini}$ of the cell and its end of life capacitance. This model considers the fact that the internal resistance increases as the cell ages, and that the capacitance of the cell diminishes as the cell ages.

In an analogous manner, the model of state 70 can be replaced by the following model of state: $RO_{k2+1}=(\alpha+\beta N^C_{k2}/N^C_{EOL})RO_{k2}+w_{2,k2}$, where the different symbols of this model have already been defined previously.

The state model 74 can be replaced by the following model of state: $C_{n,k3+1}=(1-\gamma N^C_{k3}/N^C_{EOL})C_{n,k3}+v_{3,k3}$ where the different symbols of this model have already been defined previously.

Depending on the model of observation used by the third estimator 68, the quantity $z_{k3}$ can be calculated differently. For example, the quantity $z_{k3}$ is equal to the sum of the last N currents measured between times k and k−N+1. In this case, when N is equal to 1, $z_{k3}=i_{k3}$.

What was described above for the initialization of the covariance matrices $Q_k$ and $R_k$ can also be applied to the initialization of the covariance matrices of the estimators 68 and 230.

In another practice of the method, the third estimator 68 is not implemented in the form of a Kalman filter. For example, the capacitance is estimated by simulating its development over the course of time in the form of an IIR (Infinite Impulse Response) filter whose coefficients are estimated by the RLS (Recursive Least Square) method.

The methods of both FIGS. 10 and 17 may be simplified by taking N equal to a predetermined constant. In this case, N is not counted. Therefore, the second comparison step 160 and the counting step 162 can be omitted from FIG. 10 and the alternative first comparison step 240 and the alternative counting step 242 may be omitted from FIG. 17. For example, N is chosen equal to one or, on the other hand, greater than one, or five, or ten.

In another practice of the method, at each time k between the times k3 and k3−1 only the first step 170 of the fifth phase 166, during which calculation of a prediction $C_{n,k}$ is executed. The third step 174 of the fourth phase, namely correction of this prediction, is not executed. Thus, one obtains a new prediction of the capacitance of the cell at each of these times k while limiting the computational cost of obtaining that prediction.

In a similar fashion, at each time k between the times k4 and k4−1, only the step of calculating predictions of the capacitance and the internal resistance is executed. The further step of correcting these predictions is omitted. Thus, in these alternative practices of the method, the capacitance of the cell is predicted at each time k but this prediction is corrected only at times k3 or k4. The algorithm for estimating capacitance is thus only partly executed between times k3 and k3−1 or k4 and k4−1. It is fully executed only at time k3 or k4.

At each time k between times k3 and k3−1 or between times k4 and k4−1, the capacitance can be estimated by executing a first algorithm. Then, at time k3 or k4, the capacitance is estimated by executing a second algorithm. This second algorithm is different from the first algorithm and requires more substantial computational resources. The first and second algorithms do not necessarily correspond, as described above, to respectively the first step 170 of the fifth phase 166 or estimation phase 246 of a Kalman filter. They may also be two completely different estimation algorithms.

The fifth phase 166 in FIG. 10, or the estimation phase 246 in FIG. 17 for estimation of the capacitance of the cell may be triggered in response to the crossing of a threshold for the state-of-charge, as described in connection with FIG. 10, or in response to the crossing of a threshold for the voltage as described in connection with FIG. 17. The fifth phase 166 and the estimation phase 246 may also be triggered in response to the crossing of a threshold for the amount of current output. For this, starting with the time at which the voltage or the state-of-charge of the cell has dropped below a predetermined upper threshold, at each time k the computer 44 calculates the quantity $QC_k$ of current output with the help of the following relation: $QC_k=QC_{k-1}+i_kT_e$. Once $QC_k$ crosses an upper threshold $SH_Q$, the fifth phase 166 or the estimation phase 246 is executed. On the other hand, as long as the quantity $QC_k$ remains above the threshold $SH_Q$, the execution of the fourth phase 166 or the estimation phase 246 is inhibited. In some practices, the quantity $QC_k$ may also be calculated on a sliding window containing the last N times k, where N is a predetermined constant.

In another embodiment, the triggering of estimates of the capacitance and/or the internal resistance in response to the crossing of a threshold is omitted. In some practices, these estimates are triggered at regular intervals. This regular interval is equal to $T_e$ if the available computational resources are sufficient to estimate this capacitance and this internal resistance at each time k.

Many other embodiments of the method of FIG. 12 are possible. For example, the operation 205 can be omitted. In this case, no twin cell is identified and step 212 is also omitted.

The operation 202 can be done differently. For example, a single one of the upper and lower thresholds is used. The operation 202 may also be omitted.

Although the method has been described with three priority levels, the number of priority levels is arbitrary and may be greater than at least two or three. Other methods for assigning a priority level to the cells are possible. For example, the priority level of a cell may be calculated with the help of a formula linking its priority level to its voltage difference and its voltage. In this case, it is possible to omit the comparison operations.

The method described for associating the refresh times with the cells as a function of their priority levels is only one example. Any other known method for ordering tasks as a function of the priority level of these tasks can be adapted to the case described here of the ordering of the refresh times for the estimates of the states of charge of the cells.

The scheduling of the refresh times for the estimation of the state-of-charge of each of the cells as described in regard to FIG. 12 may be omitted. For example, this will be the case if the computational resources needed for the estimation of the state-of-charge of each of the cells at each time k is available.

In an alternative implementation, the computer 44 comprises several programmable sub computers each of which is able to execute in parallel the method of estimation of FIG. 10 or 17 for respective cells.

The state-of-health of a cell may also be calculated with the help of the relation: $SOH_K=RO_K/RO^{ini}$.

The battery 10 may be replaced by any type of battery, such as, for example a lead battery, a super capacitance, or a fuel cell. In this case, the state model and/or the observation model of the first estimator 60 can optionally be adapted to take into account the battery technology.

What has been specified above also applies to the hybrid vehicle, that is, the vehicle whose driving of the powered wheels is provided at the same time, or alternately, by an electric motor and a thermal internal combustion engine. The vehicle 2 may also be a truck, a motorbike, or a tricycle and any vehicle capable of moving by driving the power wheels with the aid of an electric motor energized by a battery. For example, it may be a hoist.

The battery 10 can be recharged with the aid of an electrical outlet that allows it to be electrically connected to the electricity mains. The battery 10 can also be recharged by a thermal internal combustion engine.

The invention claimed is:

1. A method comprising automatically determining state-of-charge of a battery that comprises a set of cells that are electrically connected to one another between two electrical terminals of said battery,
wherein automatically determining state-of-charge comprises for each cell from said set of cells, acquiring, at each of a plurality of times, a measured voltage between terminals of said cell and a measured current that occurs during charge or discharge of said cell, for each cell from said set of cells, calculating a voltage difference, for each cell from said set of cells, assigning a priority level, for each cell from said set of cells,
scheduling refreshment times for said cell as a function of said cell's priority level, for at least a first cell of said set of cells, and at times that correspond to refreshment times for said first cell, fully executing an estimation algorithm for said first cell, thereby refreshing an estimate of said first cell's state-of-charge, and, for at least a second cell of said set of cells, and at times that correspond to refreshment times for said second cell, fully executing an estimation algorithm for said second cell, thereby refreshing an estimate of said second cell's state-of-charge, and determining a state-of-charge of said battery from states-of-charge estimated for each of said set of cells of said battery, wherein said set of cells store electrical energy, wherein said voltage difference is a difference between first and second voltage measurements obtained from across said terminals of said cell, wherein said first voltage measurement was obtained at a first time and said second voltage measurement was obtained at a second time that precedes said first time, wherein a priority level of a cell increases as a voltage difference calculated for said cell increases, and wherein said estimation algorithm estimates a state-of-charge of a cell at a particular time as a function of a measured voltage and a measured current, both of which are obtained at said particular time, whereby, as a result of having scheduled refreshment times for each cell based on priority levels for said cell, a first cell from said set of cells has its state-of-charge estimate refreshed more frequently than a second cell from said set of cells when said first cell has a higher priority than said second cell.

2. The method of claim 1, wherein, for each cell, assigning a priority level comprises comparing said first voltage measurement with a predetermined voltage threshold, wherein said predetermined voltage threshold is selected from the group consisting of an upper threshold and a lower threshold, if said first voltage measurement falls between said upper and lower thresholds, assigning a first priority to said cell, otherwise, assigning a second priority to said cell, wherein said second priority exceeds said first priority, and wherein said upper threshold is greater than or equal to 80 percent of a largest voltage that can be sustained between said terminals of said cell without damage to said cell, and wherein said lower threshold is less than or equal to 120% of a smallest voltage that can be sustained between terminals of said cell without damage to the cell.

3. The method of claim 1, wherein said estimation algorithm comprises a first step and a second step, wherein fully executing an estimation algorithm comprises executing said first and second steps, wherein partially executing said estimation algorithm comprises executing said first step and inhibiting execution of said second step, wherein said first step comprises calculation of a prediction of said state-of-charge of said cell with the aid of a state model that links state-of-charge of said cell at a first time to state-of-charge of said cell at a second time that precedes said first time, wherein said second step comprises correcting said prediction as a function of said first voltage measurement, wherein partially executing an estimation algorithm generates an updated estimate of state-of-charge of said cell, wherein said method further comprises partially executing said estimation algorithm for said second cell in between two refreshment times for said second cell thereby obtaining an estimate of said second cell's state-of-charge, and wherein said method further comprises determining a state-of-charge of said battery based at least in part on said updated estimate of said cell's state-of-charge obtained by partially executing said estimation algorithm for said second cell.

4. The method of claim 1, further comprising identifying a set of twin cells from said plurality of cells, wherein all cells from said set have the same voltages and the same voltage differences at the same times, said method comprising, during a refreshment time for said cells in said set, fully executing said estimation algorithm for at most a first cell in said set, thereby obtaining a refreshed state-of-charge estimate for said first cell, and using said refreshed state-of-charge estimate for said first cell as a refreshed state-of-charge estimate for remaining cells in said set.

5. A manufacture comprising a tangible and non-transitory computer-readable medium having encoded thereon instructions for causing execution of the method recited in claim 1.

6. An apparatus comprising a battery management system for managing several cells that store electrical energy, said cells being electrically connected to each other between two electrical terminals of said battery, wherein said battery management system comprises a computer that has been programmed and configured to carry out the method recited in claim 1.

7. The apparatus of claim 6, further comprising an automobile, wherein said battery-management system is a constituent of said automobile, wherein said automobile comprises a powered wheel, an electric motor able to drive this powered wheel in rotation in order to move said automobile, and said battery, wherein said battery further comprises a voltmeter connected electrically between said terminals of said cell to measure said voltage between these terminals, and an ammeter connected in series with said electrical cell to measure said charging or discharging current intensity of this cell, wherein said battery management system is connected to said voltmeter and to said ammeter.

8. A method comprising automatically determining state of charge of a battery that comprises g several electrical energy storage cells, said cells being electrically connected to one another between two electrical terminals of said battery, wherein automatically determining said state of charge comprises acquiring, at each time k and for each cell of said battery, a measured value $y_k$ of a voltage between terminals of said cell and a measured value $i_k$ of a charge or discharge current of said cell, wherein k is an integer, at least at certain of said times k and for at least one of said cells of said battery, completely executing a process for estimating a state of charge of said cell as a function of said measured value of said voltage and said measured value of said current measured for said cell at said time k, and determining a state of charge of said battery from said states of charge estimated for each of said cells of said battery, wherein automatically determining said state of charge further comprises, for each cell, calculating a difference in voltages between said measured value of said voltage between said terminals of said cell at time k and a value that was measured between said terminals at a previous time k–X, wherein X is a whole number equal to or greater than one, assigning, to each cell a priority level, wherein a priority level of a cell increases with said calculated voltage difference, scheduling times for refreshing said estimate of said state of charge of each cell as a function of said priority levels assigned to each of said cells, said scheduling comprising assigning refresh times to cells, wherein a cell that has a higher priority than another cell is assigned more refresh times than said another cell, and for each cell, fully executing said process for estimating said state of charge of said cell at each scheduled refresh time for said cell and inhibiting said full execution of this algorithm for estimation of its state of charge outside of said refresh times scheduled for said cell.

\* \* \* \* \*